United States Patent
Habetler et al.

(10) Patent No.: US 6,611,771 B1
(45) Date of Patent: Aug. 26, 2003

(54) METHOD AND APPARATUS TO DETECT A STATOR TURN FAULT IN AN AC MOTOR

(75) Inventors: Thomas G. Habetler, Snellville, GA (US); David J. Gritter, Wauwatosa, WI (US); Ronald G. Harley, Lawrenceville, GA (US); Rangarajan M. Tallam, Atlanta, GA (US)

(73) Assignee: Eaton Corporation, Cleveland, OH (US)

( * ) Notice: Subject to any disclaimer, the term of this patent is extended or adjusted under 35 U.S.C. 154(b) by 100 days.

(21) Appl. No.: 09/678,982

(22) Filed: Oct. 4, 2000

(51) Int. Cl.$^7$ .............................................. G01R 31/34
(52) U.S. Cl. .......................... 702/58; 702/64; 324/546; 324/772
(58) Field of Search .................... 702/64, 182, 183, 702/184, 185, 57, 58, 59, 65, 113, 115; 324/545, 772, 546; 361/30; 706/26, 27, 31, 41, 42, 43, 44; 318/802, 798

(56) References Cited

U.S. PATENT DOCUMENTS

| | | | |
|---|---|---|---|
| 4,204,425 A | | 5/1980 | Mallick, Jr. .................... 73/116 |
| 4,924,412 A | | 5/1990 | Leydier ........................ 702/64 |
| 5,049,815 A | * | 9/1991 | Kliman ........................ 324/772 |
| 5,126,678 A | * | 6/1992 | Williams ...................... 324/545 |
| 5,270,640 A | * | 12/1993 | Kohler et al. ................ 327/442 |
| 5,426,721 A | * | 6/1995 | Kak et al. ..................... 706/31 |
| 5,461,696 A | * | 10/1995 | Frank et al. ................. 704/232 |
| 5,512,883 A | | 4/1996 | Lane, Jr. ..................... 340/648 |
| 5,514,978 A | | 5/1996 | Koegl et al. ................. 324/772 |
| 5,548,683 A | * | 8/1996 | Engel et al. ................... 706/20 |
| 5,574,387 A | | 11/1996 | Petsche et al. ............... 324/772 |
| 5,576,632 A | * | 11/1996 | Petsche et al. ............... 324/772 |
| 5,594,670 A | | 1/1997 | Yamamoto .................... 702/64 |
| 5,612,601 A | | 3/1997 | Kueck et al. ................. 318/449 |
| 5,629,870 A | * | 5/1997 | Farag et al. ................. 700/286 |
| 5,640,103 A | | 6/1997 | Petsche et al. ............... 324/772 |
| 5,675,497 A | | 10/1997 | Petsche et al. ............... 702/182 |
| 5,727,128 A | * | 3/1998 | Morrison ....................... 706/45 |
| 5,742,522 A | | 4/1998 | Yazici et al. ................. 702/185 |
| 5,786,708 A | * | 7/1998 | Premerlani et al. ......... 324/772 |
| 5,828,227 A | | 10/1998 | Shiota et al. ................ 324/772 |
| 6,201,715 B1 | * | 3/2001 | Huggett et al. ............... 363/48 |
| 6,295,510 B1 | * | 9/2001 | Discenzo ..................... 702/183 |

OTHER PUBLICATIONS

Burton et al., "Identification and Control of Induction Motor Stator Currents Using Fast On–Line Random Training of a Neural Network," IEEE Transactions on Industry Applications, vol. 33, No. 3, pp. 697–704. May/Jun. 1997.*

Buhl et al., "Design and Implementation of Neural Networks for Digital Current Regulation of Inverter Drives", Conference Record of the 1991 Industry Applications Society Annual Meeting, vol. 1, pp. 415–421. 1991.*

Orlowska–Kowalska et al., "Neural network application for flux and speed estimation in the sensorless induction motor drive", Proceedings of the IEEE International Symposium on Industrial Electronics, Jul., 1997.*

* cited by examiner

Primary Examiner—Marc S. Hoff
Assistant Examiner—Jeffrey R West
(74) Attorney, Agent, or Firm—Ziolkowski Patent Solutions Group, LLC

(57) ABSTRACT

A stator turn fault detection system and method capable of real-time detection of a stator turn fault in an electric motor is provided. The stator turn fault detector includes a feed forward neural network that when trained, using fundamental frequency sequence components of the voltage and current supplying the electric motor, will estimate a fundamental frequency sequence component of current indicative of a stator turn fault. A method for detecting a stator turn fault in an electric motor as well as a method for training a feed forward neural network for use with the stator turn fault detector is disclosed.

40 Claims, 9 Drawing Sheets

METHOD AND APPARATUS TO DETECT A STATOR TURN FAULT IN AN AC MOTOR

BACKGROUND OF THE INVENTION

The present invention relates to an electric motor monitoring system, and more particularly, to an apparatus and method to detect a stator turn fault in an AC motor.

Electric motors, such as three-phase AC induction motors, are used in a variety of commercial and industrial environments. Refrigeration systems, printing presses, assembly lines and a myriad of other applications use such motors. Regardless of the application, timely detection of a motor fault is of utmost importance. Generally, a motor fault is not detected until complete breakdown of the electric motor, thereby, creating a situation marred with undue cost, downtime delay in repairs, as well as, potential hazardous conditions. As a result, it is necessary to efficiently and effectively detect a motor fault, specifically, a stator turn fault prior to complete breakdown of the electric motor.

State-of-the-art monitoring techniques for electric motors do not sufficiently provide for pre-breakdown detection of a stator turn fault. Typically, electric motor monitoring systems detect motor faults resulting from a defect in the rotor and defects that can only be detected during rotation. These known systems interpret changes in the harmonics of the spectrum generated by the rotor during rotation. The stator of an electric motor, however, is a stationary member and, therefore, a defect does not produce additional harmonics. Hence, application of such conventional techniques to detect a motor fault resulting from a breakdown or malfunction in the stator windings of an electric motor is not possible.

Prior art stator fault detection systems are also wrought with problems. These known stator turn fault detection systems are inefficient and time-consuming. Many methods use the model of an ideal, balanced motor, and fail because of the non-idealities in an actual machine. In one method, it is necessary to derive a "look-up table" comprising data for a plethora of operating conditions of the electric motor. In order to accumulate sufficient data to make the look-up table useful, it is necessary to run the electric motor through numerous cycles under various operating conditions. To then determine the presence of a stator turn fault, operating data gathered at a particular instant in time during normal operation of the electric motor is compared to the data of the look-up table for the electric motor under similar operating parameters. The effectiveness of determining a turn fault depends upon the scope and extent of the look-up table. The greater the scope and extent of the look up table, the greater the cost. Thus, application of known stator turn fault detection schemes are significantly limited and/or costly. Therefore, the look up table may not include data for all possible operating conditions.

Further, these prior art stator fault detection systems use a Weighted Fast Fourier Transform (WFFT). The WFFT requires several sets of data over an interval of time to perform the transformation.

It would therefore be desirable to design a stator turn fault detection apparatus and method that detects motor faults associated with the stator of the electric motor as well as obviate the need to produce a look up table to store each and every operating condition contemplated.

SUMMARY OF THE INVENTION

The present invention relates to a method and system to eliminate the need for generating an operating parameter reference table to detect motor faults and enable the use of an on-the-fly computer network that overcomes the aforementioned problems.

The present invention provides a way to readily replace the aforementioned look-up table and the need to estimate or generate each and every operating parameter of a motor by employing a feed forward neural network. The present invention includes obtaining voltage and current data of an electric motor under known healthy operating conditions. A computer program is provided to transform the existing voltage and current data such that characteristic data can be readily obtained and stored for later use. The system also includes a means to obtain instantaneous data from an electric motor under actual operating conditions. The instantaneous data is then compared to estimated data that is generated by the feed forward neural network. Based upon the comparison of the aforementioned data, an onset of a stator turn fault in the electric motor can be accurately identified.

Therefore, in accordance with one aspect of the invention, a stator turn fault detector for an electric motor is disclosed. The detector includes a plurality of sensors to obtain current and voltage signals supplying the electric motor. Sequence components of the current and voltage data are then calculated by a processor connected to the plurality of sensors as well as connected to a feed forward neural network. The feed forward neural network receives the current and voltage values, or at least a portion thereof, and calculates estimated values which are output to a comparator. Based upon an analysis of the estimated value and instantaneous values, an onset of a stator turn fault can be determined.

In accordance with another aspect of the invention, a stator turn fault detection system is disclosed that includes a microprocessor and a computer readable storage medium. When instructed by a computer program stored on the computer readable storage medium, the microprocessor receives, through at least one input, fundamental frequency data having a positive and negative sequence component of line voltage and a positive sequence component of line current supplying an electric motor. The microprocessor when instructed by the computer program further initiates a feed forward neural network that, based upon the aforementioned data, determines an estimated negative sequence component of the line current. The present invention also includes at least one output to output the estimated negative sequence component of the line current.

In yet another aspect of the present invention, an apparatus for detecting a stator turn fault in an electric motor includes a means for receiving line voltage signals and line current signals from an electric motor known to be operating properly. A transformation means for determining the sequence components of at least a portion of the voltage and current signals, continuously in time is also provided. The present invention further includes a means for outputting estimated current values based upon the aforementioned sequence components. The estimated current values are subsequently compared in real-time to instantaneously acquired current values through a comparing means.

In accordance with another aspect of the invention, a computer program is disclosed to detect a stator turn fault in an electric motor. When executed the computer program will cause a computer to acquire fundamental frequency data of an electric motor during good working order operation. The computer program will further cause at least a portion of the fundamental frequency data to be input to a feed forward neural network having a number of weights. The computer will then train the feed forward neural network to converge each weight to a value and store the value in memory. The computer will also obtain fundamental frequency data from the electric motor during instantaneous operation. The instantaneous fundamental frequency parameter is then input to the feed forward neural network. The computer will then obtain an estimated fundamental frequency parameter of instantaneous operation of the motor and compare that parameter to the instantaneous fundamental frequency parameter to determine a turn fault in the AC motor.

In a further aspect of the present invention, an apparatus to detect a stator turn fault in an AC induction motor is disclosed. The apparatus includes at least two current sensors to obtain at least two AC motor current signals as well as at least two voltage sensors for obtaining AC motor voltage signals. The AC motor current signals and the AC motor voltage signals are input to an analog-to-digital converter to produce digitized current signals and digitized voltage signals. A microprocessor is also contemplated in the present invention to interpret the digitized signals to calculate fundamental frequency sequence parameters of AC motor operation. Estimated fundamental frequency parameters of operation of the AC motor are determined by a feed forward neural network.

In accordance with yet another aspect of the present invention, a method is disclosed for detecting the presence of a stator turn fault in an electric motor which includes the steps of acquiring fundamental frequency training parameters from the electric motor during healthy operating conditions of the electric motor. The method of detecting a stator turn fault also includes determining sequence phasors from the fundamental frequency training parameters to determine estimated fundamental frequency values of normal operation of the electric motor and determining those estimated fundamental frequency values. Preferably, the method includes the additional steps of acquiring instantaneous fundamental frequency values from the electric motor while in service. The method next compares the instantaneous fundamental frequency values to the estimated fundamental frequency values of operation to determine a fault value and indicate the fault value based on the comparison. The fault value being indicative of the presence of a stator turn fault within the electric motor.

In a further aspect of the present invention a method for determining the presence of a stator turn fault in an AC induction motor includes the steps of selecting the sequence phasor parameters of a feed forward neural network and training the feed forward neural network to learn a model of the AC induction motor under healthy operating conditions. The method then acquires a measured value of the AC induction motor while in service and compares the measured value taken from the in-service electric motor to an estimated value of AC induction motor operation. The method then repeats the aforementioned steps until a turn fault value that exceeds a vigilance is detected. When such a turn fault value is detected, the method indicates the presence of a stator turn fault in the AC induction motor to a user.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
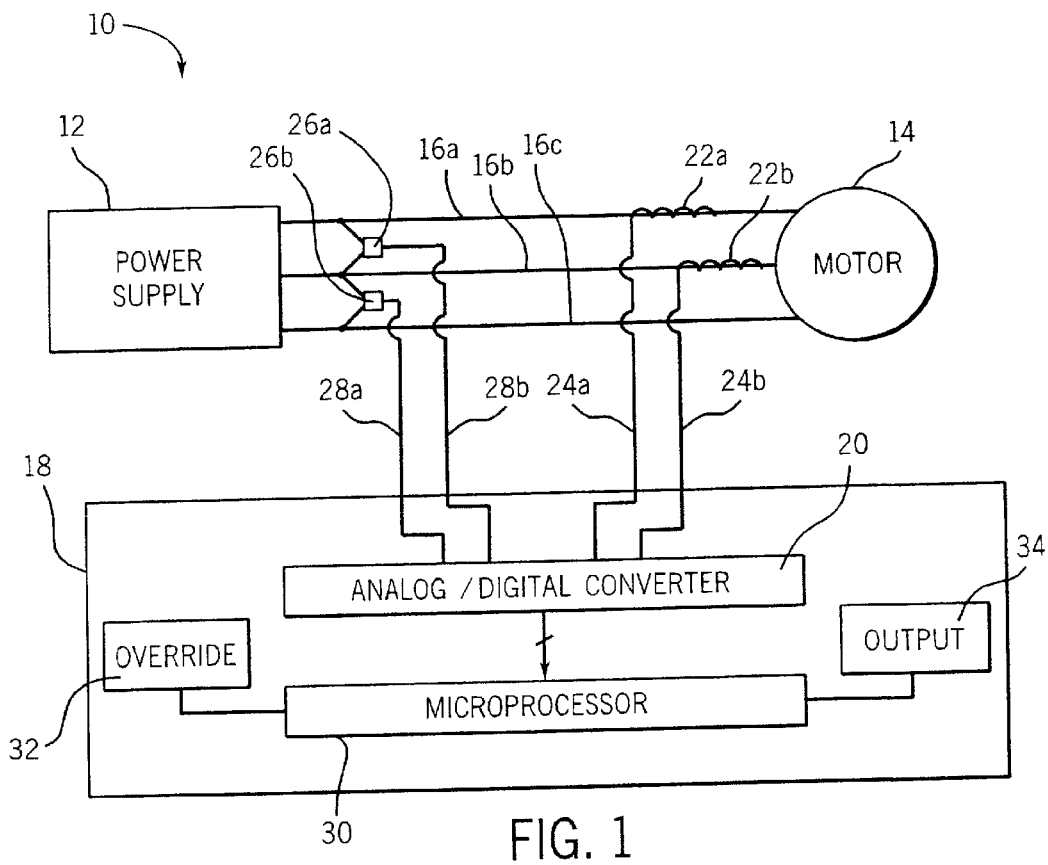
FIG. 1 is a schematic drawing of a turn fault detector of the present invention.

The operating environment of the present invention will described with respect to a three-phase AC induction electric motor as shown in FIG. 1. However, it will be appreciated that this invention is applicable for use with single-phase or other poly-phase AC motors as well as other types of electric motors.

Figure 2:
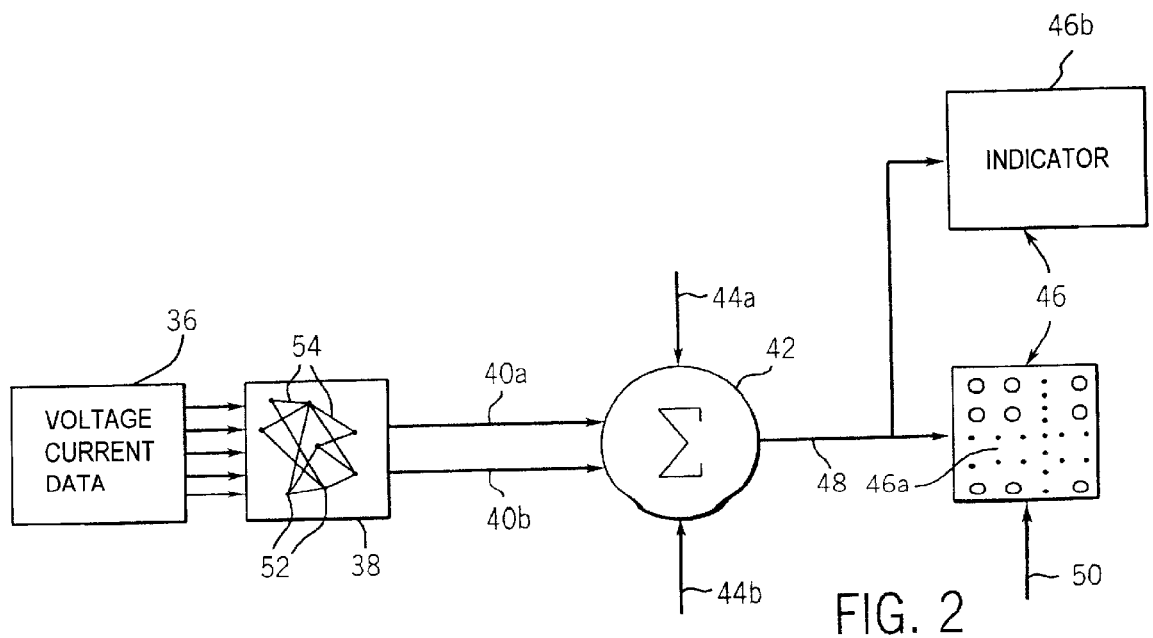
FIG. 2 is a block diagram of a turn fault detection scheme used with the turn fault detector shown in FIG. 1.

A turn fault detector, FIG. 1, incorporating the turn fault detection scheme illustrated in FIG. 2 is disclosed herein. With reference to FIG. 1, a stator turn fault system 10 includes a power supply 12 connected to an electric motor 14 via transmission lines 16a, 16b, and 16c. The system 10 further includes a general purpose computer 18 having an analog-to-digital converter (A/D converter) 20 to monitor current and voltage being transmitted to the electric motor 14 across transmission lines 16a, 16b, and 16c. Current sensors 22a and 22b obtain waveforms of the current traveling to the motor 14 and transmit the waveforms to the A/D converter 20 via transmission lines 24a, 24b. Voltage sensors 26a and 26b obtain waveforms of the voltage supplied to the motor 14 and transmit the waveforms to the A/D converter 20 through transmission lines 28a, 28b. The A/D converter 20 receives the current and voltage waveforms and digitizes each waveform so that measurements of the waveforms can be readily obtained. The computer 18 has a microprocessor 30 that receives the digitized signals from the A/D converter 20 and executes a computer program that will cause the microprocessor 30 to analyze the digitized signals, as will be discussed in accordance with FIGS. 3–10.

The computer 18 has an override terminal 32 connected to the microprocessor 30 that when activated allows a user of the AC induction motor 14 to override the output of the microprocessor 30. Such an override may be useful to delay a shutdown in critical applications where the process must continue regardless of a motor fault. The microprocessor 30 outputs data to the user of the motor 14 through an output terminal 34.

FIG. 2 is a block diagram of a system implemented with a computer program to be executed by the microprocessor 30. Voltage and current data 36 of the digitized waveforms are input to a feed forward neural network 38 that processes the data 36 and outputs estimated values for the real 40a and imaginary 40b part of the negative sequence components of current of the electric motor 14 in actual operation. A comparator 42 receives the estimated data 40a, 40b and compares the estimated data 40a, 40b to actual data components that include a real component 44a and an imaginary component 44b of negative sequence current of the electric motor 14 obtained during actual operation. The comparator 42 generally includes an adder, a subtractor, or summer, as hereinafter generally referred to as a comparator. A fault indicator 46 receives the output values from the comparator 42 and indicates the presence of a fault condition 48 in the electric motor 14. The present invention contemplates a variety of fault indicators 46 including, but not limited to, a Self-Organizing Feature Map (SOFM) 46a, that may prevent further operation of the electric motor 14, sound a horn, display the fault with a fluctuation of a needle, and/or output flashing lights, among others. The SOFM 46a is a neural network to graphically display the operating condition of the electric motor 14. To properly display the operating condition of the electric motor 14, the SOFM 46a receives as inputs, the output value 48 and the magnitude of the negative sequence voltage 50. The present invention contemplates the use of an alternative or a second fault indicator 46b. The second indicator 46b can includes a meter, a set of fault lights, or any combination of the fault indicators heretofore referenced. One of ordinary skill in the art of detecting stator turn faults will recognize that implementation of the present invention does not rest with the use of the SOFM 46a instead of any other particular fault indicator.

Figure 3:
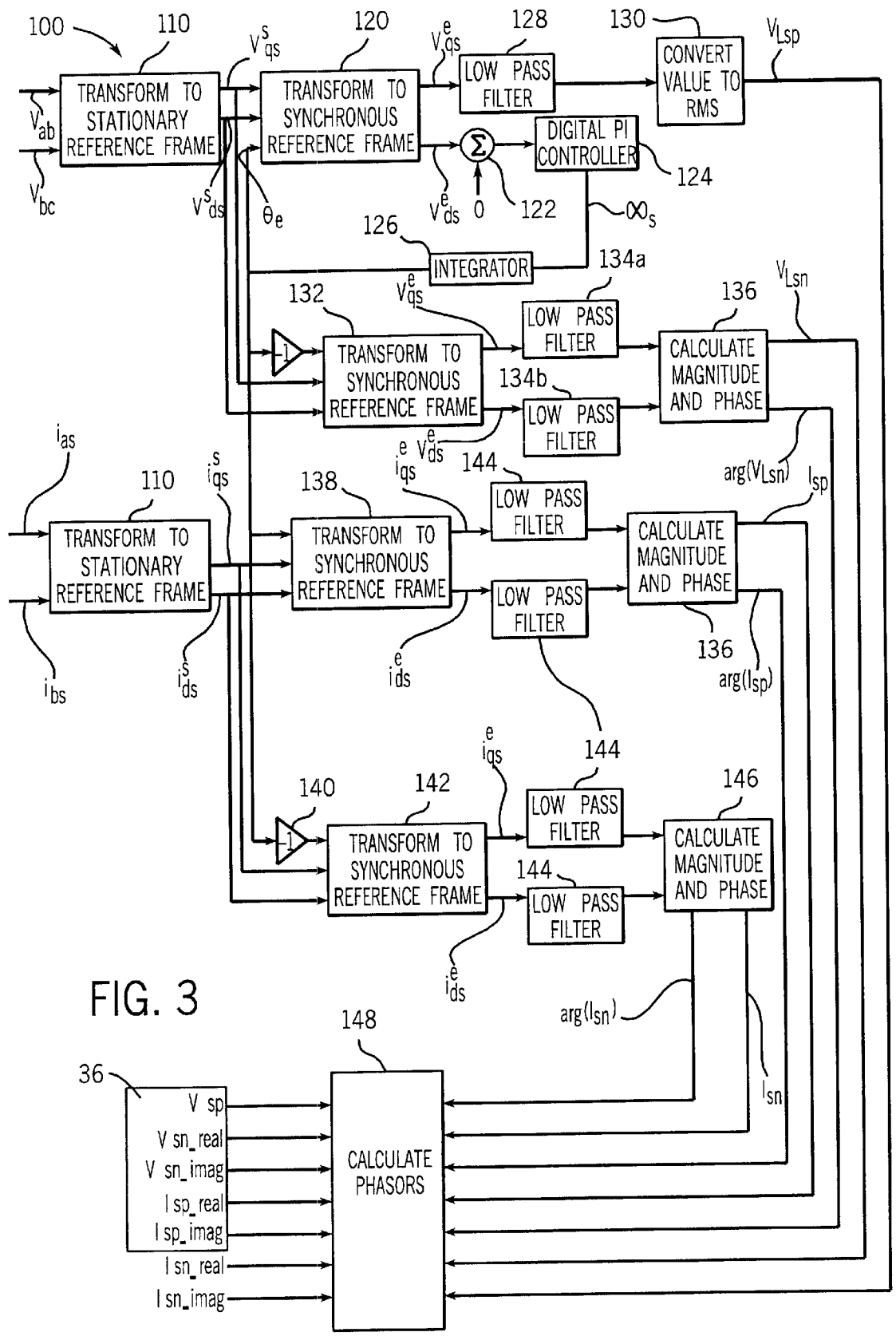
FIG. 3 is a block diagram which illustrates a related embodiment of the present invention used for determining the sequence components of line voltage and line current of the electric motor shown in FIG. 1.

FIG. 3 illustrates the transformation of the digitized current and voltage waveforms when received by the microprocessor 30 from the A/D converter 20. The transformation is generally referred to as a Synchronous Reference Frame (SRF) transformation and is generally known. SRF is a technique for transforming digitized data that, unlike the Fast Fourier Transform (FFT), allows for continuous transformation of data. Unlike the SRF transformation, several cycles of data collection are required before the FFT can be performed upon the digitized data before a usable result is obtained.

Preferably, the SRF transformation 100 begins with obtaining two line currents and two line voltages in a manner set forth above, with reference to FIG. 2. The two line voltages $V_{ab}$, $V_{bc}$ are transformed to a stationary reference frame 110 to calculate a d-axis and a q-axis of stationary voltage, $v^s_{qs}$ and $v^s_{ds}$, respectively, each being real numbers. $V^s_{qs}$ and $v^s_{ds}$ are transformed to a synchronous reference frame 120. To transform $v^s_{qs}$ and $v^s_{ds}$ to a synchronous reference frame 120, a transformation angle $\Theta_e$ must also be input to the synchronous reference frame 120. An output of the synchronous reference frame 120, $v^e_{ds}$, is input to an adder 122. The output of the adder 122 is input to a digital PI controller 124 to regulate the d-axis voltage to zero. By adjusting the frequency $\omega_s$, in a closed loop, and employing an integrator 126, the value of the transformation angle, $\Theta_e$, is converged so that the d-axis voltage, $v^e_{ds}$, is forced to zero. Thus, the q-axis of the synchronous voltage, $v^e_{qs}$, undergoes low pass filtering 128 and conversion to RMS values 130 to produce the magnitude of the positive sequence component of the line—line voltage, $V_{Lsp}$. The RMS value of the resultant, $V_{Lsp}$, is output for line-to-neutral phasor calculation 148.

To determine the magnitude and phase of the negative sequence component of the line-to-line voltage, $V_{Lsn}$ and $\arg(V_{Lsn})$, respectively, the stationary q-axis voltage, $v^s_{qs}$, and the stationary d-axis voltage, $v^s_{ds}$, as well as the negative of the converged transformation angle, $\Theta_e$, are input to a synchronous reference frame 132. The synchronous reference frame outputs, $v^e_{qs}$, and $v^e_{ds}$, undergo low pass filtering 134a, 134b before calculating $V_{Lsn}$ and $\arg(V_{Lsn})$. Calculation 136 of $V_{Lsn}$ and $\arg(V_{Lsn})$ are set forth below:

$$|\tilde{V}_{Lsn}| = \frac{1}{\sqrt{2}} \sqrt{(v^e_{qs})^2 + (v^e_{ds})^2} \qquad (1)$$

$$\arg(\tilde{V}_{Lsn}) = \tan^{-1}\left(\frac{v^e_{ds}}{v^e_{qs}}\right) \qquad (2)$$

The magnitude and phase of the negative sequence component of the line-to-line voltage as calculated are output for line-to-neutral phasor calculation 148.

Calculation of the magnitude and phase of both the positive and negative sequence components of the current waveform is very similar to the calculation of the negative sequence components, both magnitude and phase, of the line-to-line voltage. It should be noted, however, that the transformation angle, $\Theta_e$, and not its negative, is input for transformation to synchronous reference frame 138 to calculate the magnitude and phase for the positive sequence component of line current. Calculation of the positive sequence components of line current are as follows:

$$I_{sp} = \sqrt{(i^e_{qs})^2 + (i^e_{ds})^2} \qquad (3)$$

$$\arg(I_{sp}) = \tan^{-1}(i^e_{ds}/i^e_{qs}) \qquad (4)$$

To calculate the negative sequence components of line current, the transformation angle, $\Theta_e$, is multiplied by $-1$ 140. $\Theta_e$ as modified, $i_{sqs}$, and $i_{sds}$ are input to a synchronous reference frame 142. The result at 142 is two values, $i^e_{qs}$ and $i^e_{ds}$, that, after low pass filtering 144, are used to calculate 146 which provides the negative sequence components of the line-to-line current. The equations for calculating the negative sequence components of line current are:

$$I_{sn} = \sqrt{(i_{qs}^{e^2} + i_{ds}^{e^2})/2} \qquad (5)$$

$$\arg(I_{sn}) = \tan^{-1}(I^e_{ds}/I^e_{qs}) \qquad (6)$$

The positive and negative sequence components, having both magnitude and phase, are then output for the phasor calculation at 148.

Phasor calculation 148 is necessary to calculate the input data 36 of the feed forward neural network 38 of FIG. 2. The input data 36 to the feed forward neural network 38, $V_{sp}$, $V_{sn\_real}$, $V_{sn\_imag.}$, $I_{sp\_real}$, and $I_{sp\_image.}$ is calculated as follows:

$$V_{sp} = \left|\frac{1}{\sqrt{3}} \tilde{V}_{Lsp}\right| \qquad (7)$$

$$V_{sn\_real} = \text{Re}\left\{\frac{1}{\sqrt{3}} \tilde{V}_{Lsn} e^{j\pi/3}\right\} \qquad (8)$$

$$V_{sn\_imag} = \text{Im}\left\{\frac{1}{\sqrt{3}} \tilde{V}_{Lsn} e^{j\pi/3}\right\} \qquad (9)$$

$$I_{sp\_real} = \text{Re}\{\tilde{I}_{sp} e^{j\pi/6}\} \qquad (10)$$

$$I_{sp\_imag} = \text{Im}\{\tilde{I}_{sp} e^{j\pi/6}\} \qquad (11)$$

The phasor calculation 148 of the negative sequence components of line current, both real and imaginary, $I_{sn_{13} real}$ and $I_{sn\_imag}$, are compared to the estimated negative sequence components 40a, 40b generated by the feed forward neural network 38 as discussed with reference to FIG. 2.

Figure 4:
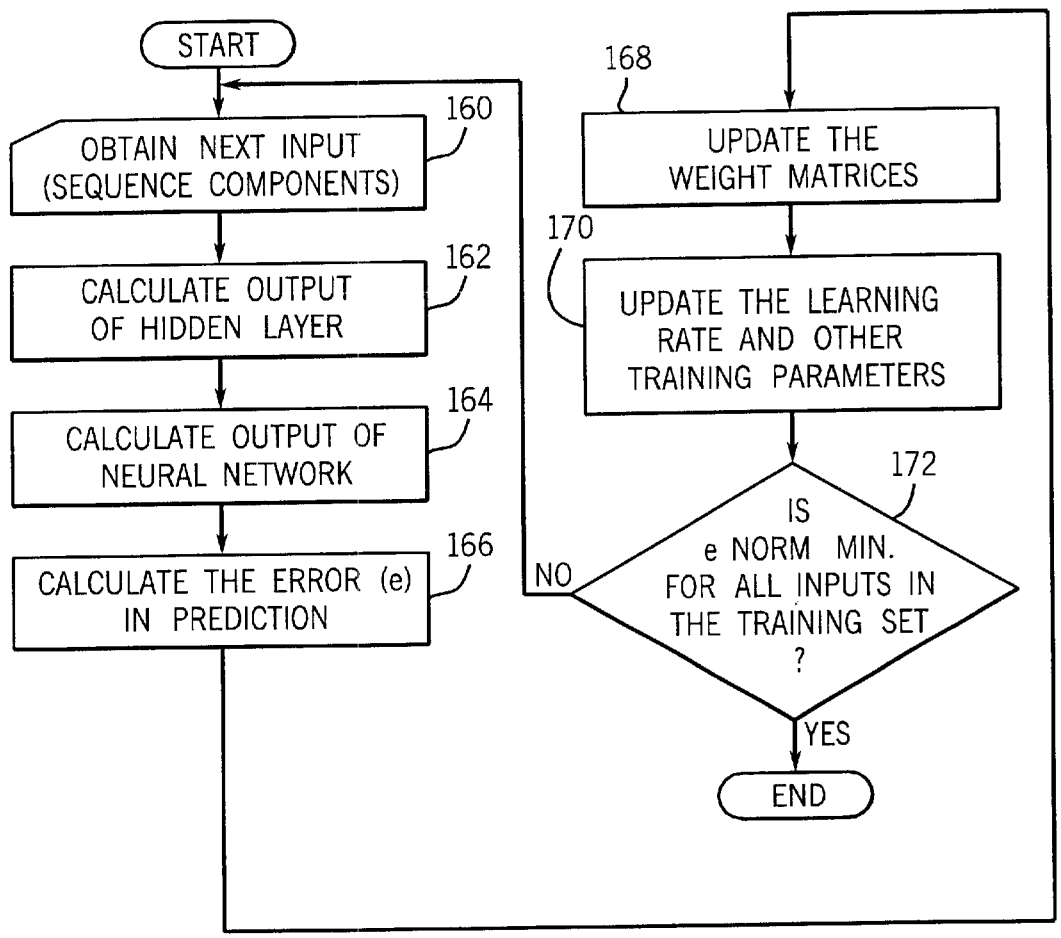
FIG. 4 is a flow chart showing general training of a feed forward neural network for use with the device shown in FIG. 1.

The feed forward neural network 38 contemplated by the instant invention has two distinct stages of operation: the training stage and the testing stage. FIG. 4 is a flow chart of the most general training method of the feed forward neural network 38. Training of the feed forward neural network 38 begins with inputting 160 of the input data 36 to the hidden layer of the network 38 in the form of a 5×1 input vector, p. The hidden layer consists of a number of hidden layer neurons 52, $M_{hid}$, and weights 54 forming a weight matrix, $W_{hid}$, having dimensions of $5 \times M_{hid}$. The weights are set to a predetermined value that will change in response to changes in the input data 36. Typically, each weight is pre-set to a zero value. The hidden layer neurons 52 correspond to specified arithmetic functions to be performed upon the input data 36, as will be discussed shortly. To determine the output of the hidden layer generally shown at step 162, the product of the transpose of the hidden layer weight matrix, $W_{hid}^T$, and p are added to $b_{hid}$, a bias vector for hidden layer neurons dimensioned as $M_{hid} \times 1$. The hyperbolic tangent is taken of the sum to determine the output of the hidden layer, $Y_{hid}$, as shown in Eq. 14.

$$y_{hid} = \tan h(w_{hd}^T p + b_{hid}) \quad (12)$$

After determining the output of the hidden layer 162, $y_{hid}$, the output of the neural network, $y_{out}$, is calculated in the output layer at 164. Generally, the output layer consists of a number of neurons and weights (not shown). Solving Eq. 15 set forth below produces $y_{out}$. $W_{out}^T$ generally represents the transpose of $W_{out}$ and $b_{out}$ generally represents a 2×1 bias vector for output layer neurons; $W_{out}$ being an output layer weight matrix dimensioned as $M_{hid} \times 2$.

$$y_{out} = W_{out}^T y_{hid} + b_{out} \quad (13)$$

The output, $y_{out}$, of the feed forward neural network 38 is then subtracted from measured values, $y_{des}$, of continued training operation of the electric motor 14, in accordance with Eq. 16 to calculate the error in prediction 166. Like $y_{out}$, $y_{des}$ is a 2×1 vector of negative sequence components, having a magnitude and phase, of line current of the electric motor 14.

$$e = y_{des} - y_{out} \quad (14)$$

As produced by Eq. 16, the difference, e, of $y_{des}$ and $y_{out}$ indicates the difference between actual values of operation of the electric motor 14 and estimated values generated by the feed forward neural network 38 and is generally referred to as the error in prediction. If there are no unbalanced supply voltages or inherent asymmetries in the electric motor 14 or instrumentation, the value of e will be zero. However, exact balance in supply voltages or instrumentation without inherent asymmetries is unlikely. As a result, e will likely have some positive value however slight.

After calculating e 166, the value of the weight matrices are updated 168 in accordance with a known "delta rule". The delta rule is a means of updating weight matrices of a neural network and is generally known and is disclosed in *Neural Networks: A Comprehensive Founidation* (Prentice Hall, 1999) by Simon Haykin. After updating the weight matrices 168 the learning rate and other training parameters are updated 170.

After updating the weight matrices 168 and the learning rate and other training parameters 170, the norm of e is evaluated at 172 to determine if the value is small enough given the training inputs 36. If the norm of e is not small enough new input data 36 is obtained and input to the hidden layer at 160 and e is eventually recalculated with the values for the weights of the hidden layer and output layer are changed. The error in prediction will not be sufficiently small enough until the weights for the hidden layer and the output layer have converged to appropriate values. Convergence of the weights occurring when the error in prediction is equal to zero or some other value deemed acceptable by the user of the detection system 10. The microprocessor 30 stores the weights values at convergence in memory for use during the testing stage of the feed forward neural network 38 in memory. The microprocessor 20 stores the weights values at convergence in memory for use during the testing stage of the feed forward neural network 38 in memory.

When the norm of e is sufficiently small, then the training stage of the feed forward neural network 38 is complete. Determining if the norm of e is sufficiently small depends upon a predetermined threshold value. Depending on the operating conditions and proposed use of the electric motor 14, an error in prediction of ten percent may be sufficiently small whereas other applications may require a much lower error in prediction.

Figure 5:
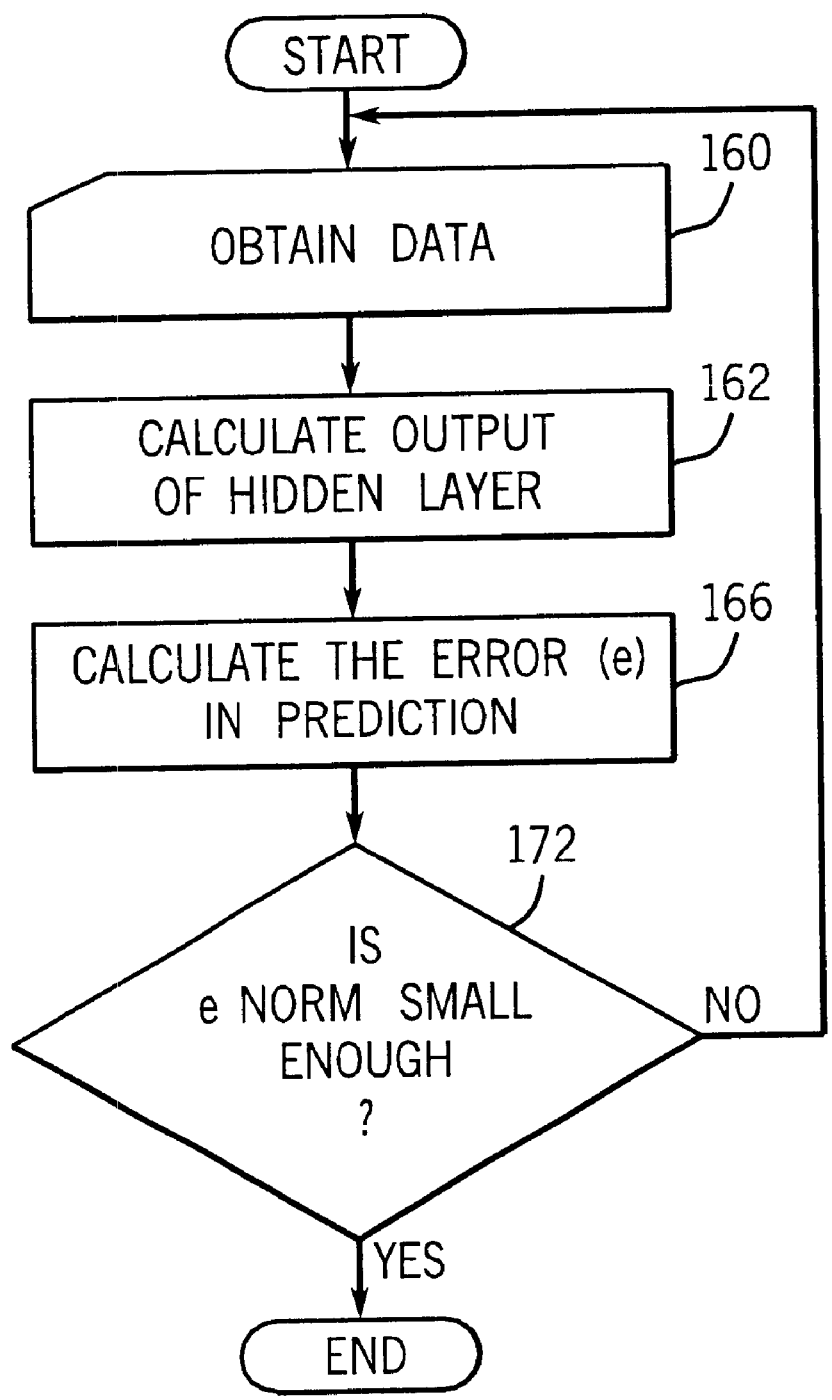
FIG. 5 is a flow chart illustrating one embodiment for operating the feed forward neural network for use with the device of FIG. 1.

FIG. 5 illustrates one known embodiment for operating the feed forward neural network 38 commonly referred to as "Global Minimal Training" (GMT). GMT of the neural network 38 is very similar to the general training of a neural network 38 as shown in FIG. 4. With GMT, however, when the motor is in service the weight matrices are neither updated nor are the learning rate and training parameters. To incorporate GMT, data corresponding to different current and voltage conditions must be available prior to training, or accumulated over a period of time. As a result, the electric motor 14 must be run through several operating cycles so that sufficient training data is obtained. To achieve the most precise global minimal, a large dataset is required in addition to substantial data memory, the large dataset requiring a long training time. As the number of training points increases the accuracy of the functional approximation, the global minimal, improves. Compared to other training methods, as will be discussed shortly, global minimal training is currently believed to be more costly and inefficient.

Figure 6:
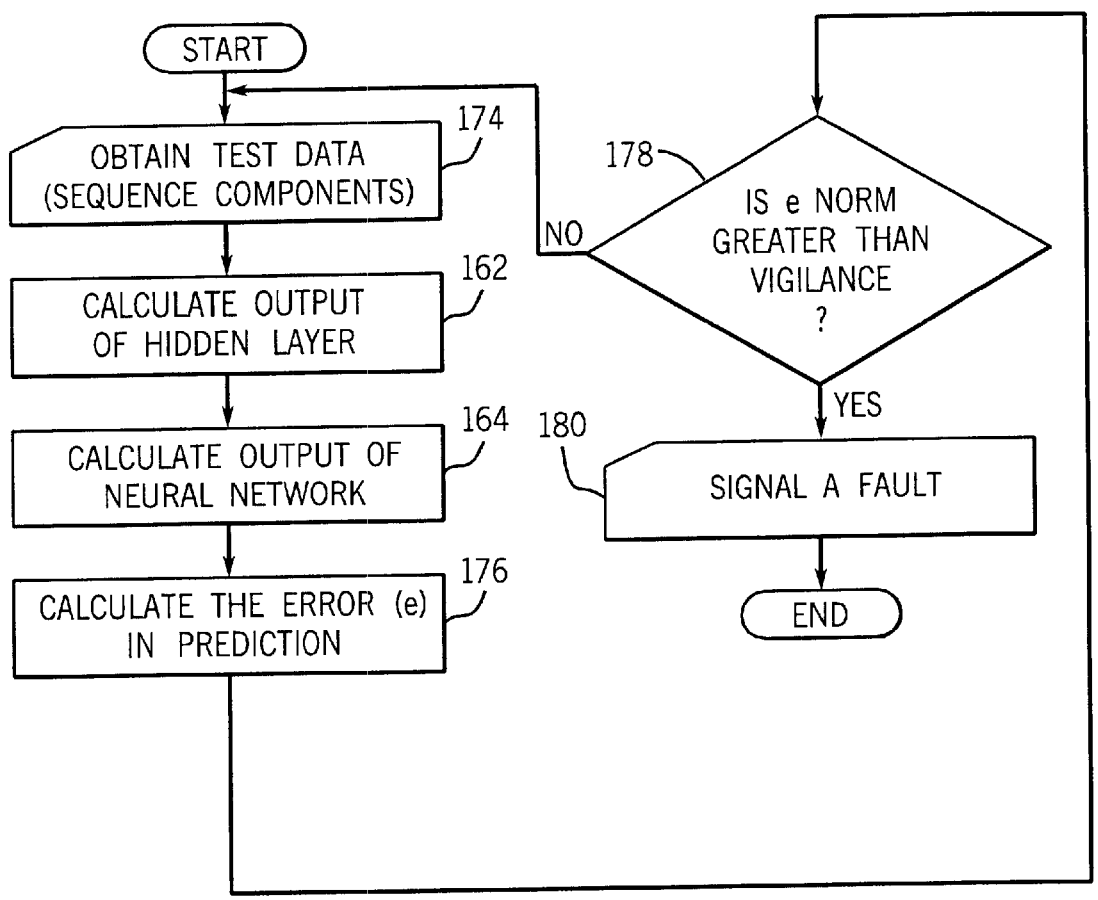
FIG. 6 is a flow chart illustrating one embodiment for testing the feed forward neural network of the device shown in FIG. 1 as trained in FIG. 5.

FIG. 6 illustrates testing of the feed forward neural network 38 once the weights of the hidden and output layers have converged using the GMT process of FIG. 5 with the general training of FIG. 4. Sequence components of line voltage and line current are input at 174 into the neural network 38, and then the outports of the hidden layer and neural network are calculated at 162, 164, as described with reference to FIG. 4. The error is then calculated at 176, but unlike the training stage, the error in prediction is not an indication of the inexactitude of the weights, but rather, an indication of an onset of a turn stator turn fault in the electric motor 14. Since the weights converged during the training of the feed forward neural network 38 based on data collected from a working electric motor 14, asymmetries in the instrumentation and the electric motor as well as unbalanced voltages are taken into account. Essentially, during the training stage the feed forward neural network 38 learns the operating conditions of the electric motor 14 having non-idealities present.

Testing of the feed forward neural network 38 concludes with a comparison of the normalization of the error in prediction with a vigilance value at 178. The vigilance value is a user-determined value indicating the tolerance the user has for breakdown in the electric motor. A high vigilance would require a higher error in prediction to signal a turn fault error 180 in the electric motor 14 whereas a lower vigilance would mandate a much lower value of e. If the normalization of e is greater than the vigilance at 178, then a turn fault is signaled at 180. If not, the feed forward neural network 38 reacquires sequence component data at 174 and the testing stage repeats. As long as the norm of e does not exceed the vigilance, the loop beginning at 174 will be continuous.

Figure 7:
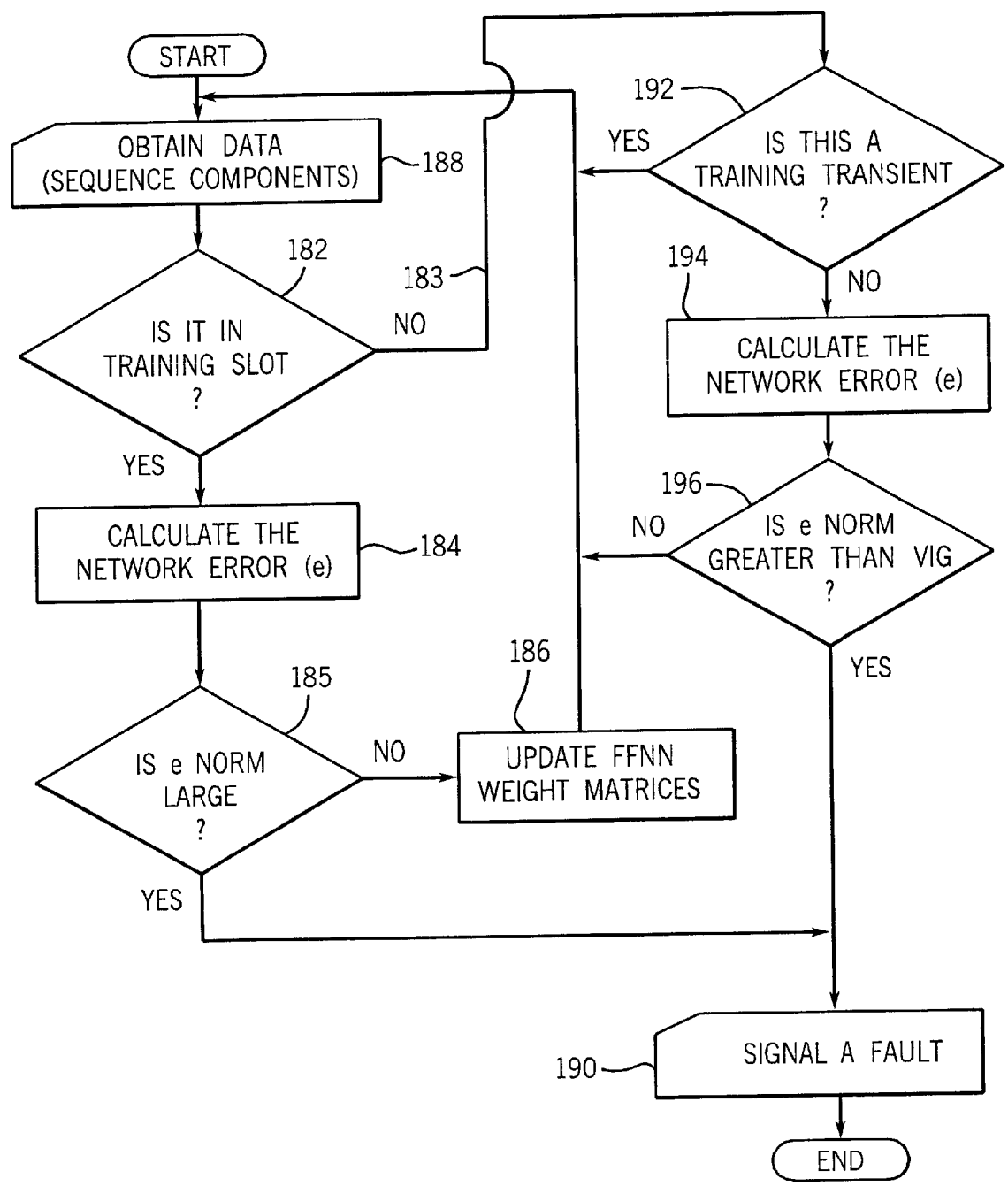
FIG. 7 is a flow chart illustrating another embodiment for training and testing a feed forward neural network for use with the device shown in FIG. 1.

FIG. 7 illustrates another known embodiment for training and testing the feed forward neural network 38 commonly referred to as Continual-Online Training (COT). Although COT is a known method for training the feed forward neural network 38, COT has not been applied in stator turn fault detection schemes: In Continual Online Training, sequence components are obtained as previously discussed. With COT, every T seconds there are a number of testing slots and one training slot. Therefore, the weights of the feed forward neural network 38 can be updated quasi-continuously in response to changes in the sequence components. Typically, every fifth slot is a training slot during which sequence component data will be used to update the weight matrices. The four remaining slots are set aside for testing data which will be used to determine if a stator turn fault is present in the electric motor 14. While in a training slot, the error in prediction 184 is determined by solving Equation 16. If the error in prediction is large enough at 185, a fault is signaled at 190 to the user of the electric motor 14. If the error in prediction is not large enough, then the weight matrices are updated at 186 and new sequence component data is obtained 188. While not in a training slot 182, 183, the sequence components undergo a training transient evaluation 192. The training transient evaluation 192 determines if the COT is in a training transient. If a training transient is occurring, then new sequence components are obtained at 188 and the training begins anew. If a training transient is not present, then the network error e is calculated at 194 as discussed in references to FIG. 4. The network error e is then compared to the vigilance value at 196 to determine if a turn fault should be signaled 190 to the user of the electric motor 14.

Figure 8:
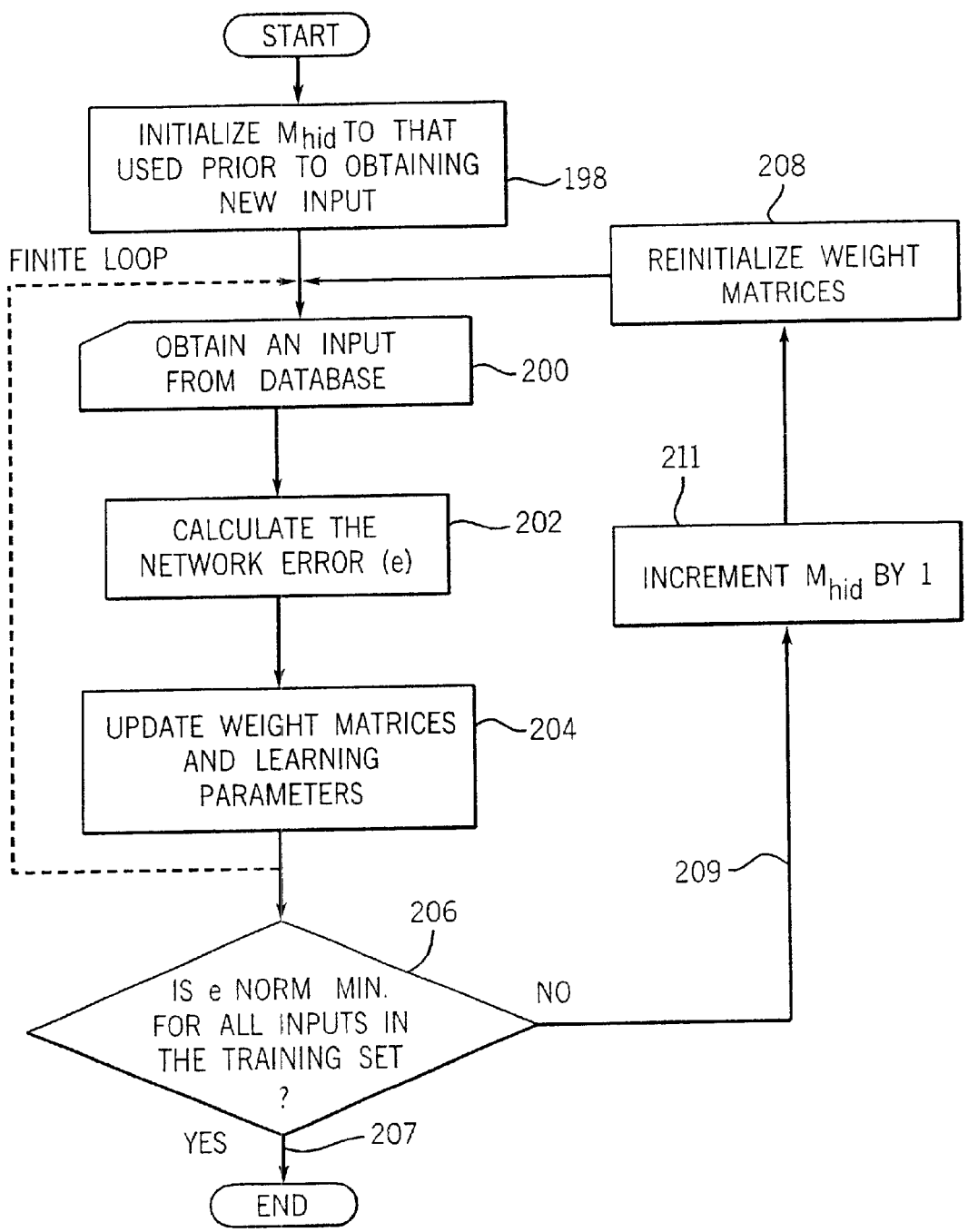
FIG. 8 is a flow chart illustrating another embodiment for training the feed forward neural network of the device shown in FIG. 1.

Quasi-Global Minimum training (QGM) as shown in FIG. 8 is another embodiment for training the feed forward neural network 38. The QGM training is very similar to the Global Minimum Training, FIG. 5, except the size of the database is limited. Typically, the database is large enough to correspond to the number of different operating conditions seen during the course of a single day. The database is updated over a period of time and when a new input is obtained with the database full, an existing input is discarded such that the remaining data presents the best possible training set to the feed forward neural network 38 from the convergence point of view. As a result, weights are updated only when a new input is added to the database. Hence, compared to the COT scheme of FIG. 7, the QGM scheme has fewer computations requirements.

With Quasi-Global Minimum training, the number of hidden layer neurons, $M_{hid}$, are initialized prior to obtaining a new input 198. After initializing the number of hidden layer neurons, sequence components stored on the database 200 are input to the hidden layer of the feed forward neural network 38 so that the error in prediction, e, as previously set forth is obtained. After the error in prediction is calculated 202, the weight matrices and learning parameters are updated 204 as discussed with reference to FIG. 4. If the norm of the error in prediction is small enough 206, 207 the training of the feed forward neural network 38 ceases. If not, 206, 209, the number of hidden layer neurons are incremented by one 211 and the weight matrices are reinitialized at 208. To limit the training error to a predetermined threshold, the number of hidden layer neurons must increase as the size of the database increases. If a new input is significantly different from the sequence components stored on the database, then the feed forward neural network weights 54 may not converge and the error in prediction will remain high. As a result, testing of the feed forward neural network 38 must be discontinued until sufficient inputs are added to the database so that the weights 54 are able to converge.

Since the COT algorithm does not have a database to store input data 36, and the QGM algorithm may not converge the weights if a significantly different input is obtained from the database, the present invention contemplates a combination of each algorithm. Using a combination COT-QGM algorithm, two sets of weights are used for fault diagnosis. One set is trained by the COT algorithm and the other set is trained by the QGM scheme. Since, only one scheme is active at any given time, computational complexity is not increased.

Figure 9:
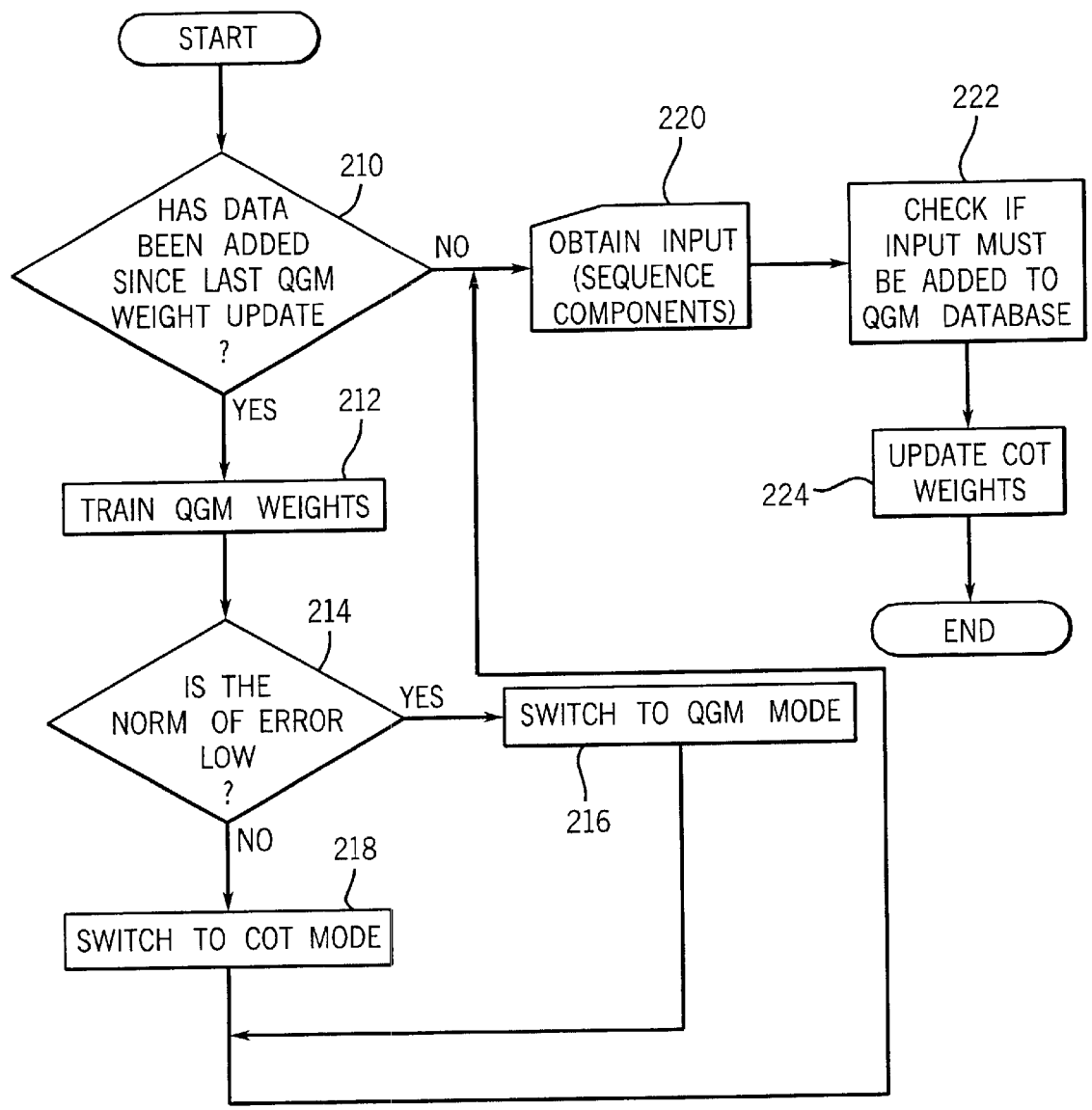
FIG. 9 is a flow chart illustrating a further embodiment for training the feed forward neural network of the present invention shown in FIG. 1.

FIG. 9 illustrates the training algorithm for the COT-QGM mode. Before obtaining the input data 36, sequence components of line current and line voltage, a determination is made to determine if data 36 has been added since the last QGM weight update 210. If data 36 has been added, the weights of the feed forward neural network are trained at 212 in accordance with the GMT algorithm as discussed in reference to FIG. 4. If the norm of the error in prediction, e, is low 214 the QGM algorithm is initiated at 216. If the norm of the error in prediction is not low, then the COT algorithm is implemented at 218. Regardless of which mode is implemented the COT-QGM algorithm obtains at 220 sequence components for input to the feed forward neural network 38. The COT-QGM algorithm determines if input needs to be added to the quasi-global minimum database at 222. The COT weights 54 are then updated at 224 even while operating in the QGM mode in accordance with FIG. 8. This is to ensure that following a switch-over from the QGM mode to the COT mode an unreasonably long time for the COT weights 54 to converge with error in prediction less than a predetermined threshold does not occur.

Figure 10:
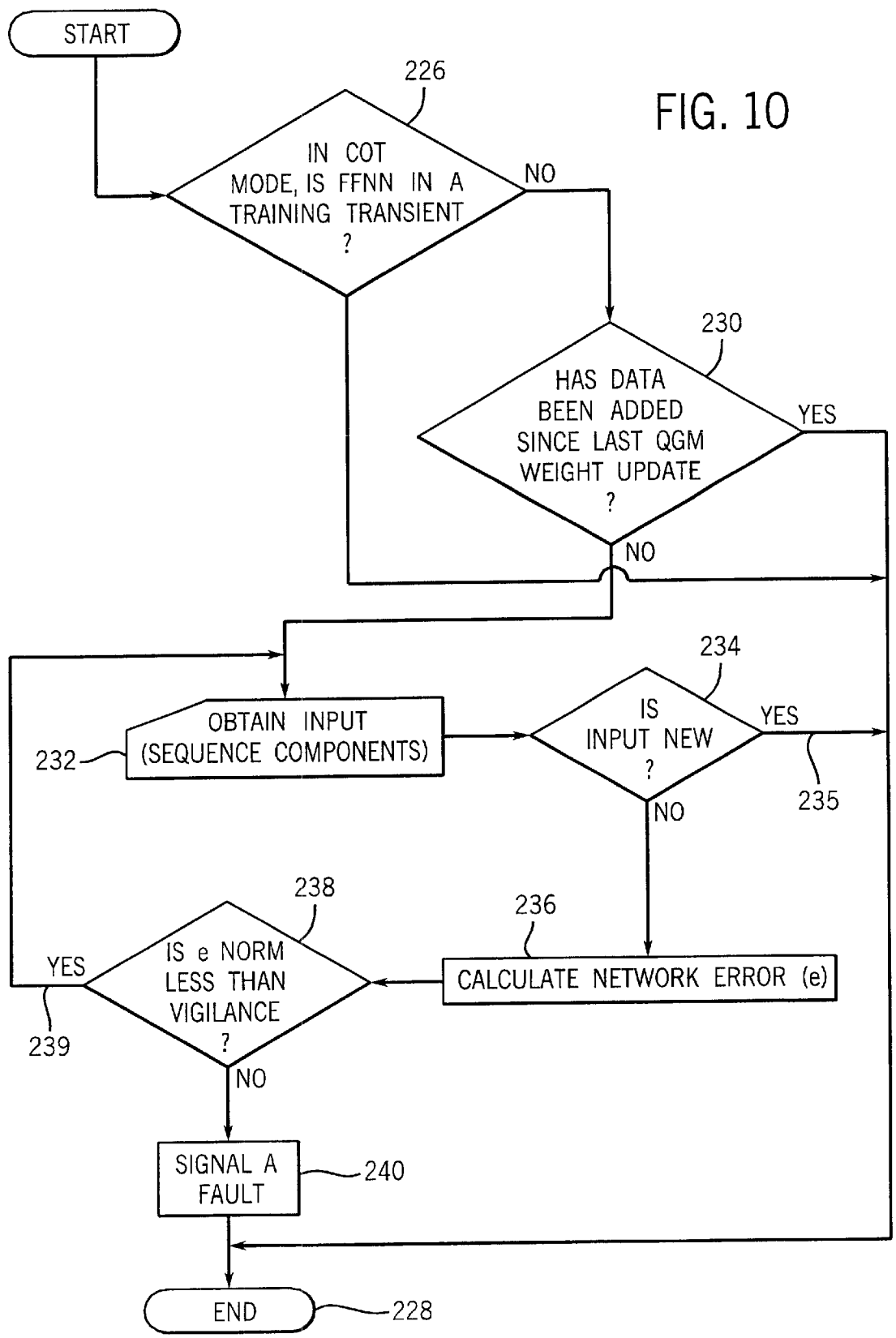
FIG. 10 is a flow chart illustrating the testing of a feed forward neural network as shown in FIG. 1 trained in accordance with FIG. 8.

Now referring to FIG. 10, with the testing algorithm for the COT-QGM complete, a determination is made to determine if the feed forward neural network 38 is in a training transient 226. If so, the testing mode of the COT-QGM scheme is terminated at 228. If not, the COT-QGM algorithm determines at 230 if data 36 has been added since the last quasi-global minimum weight update. If so, the testing mode of the COT-QGM algorithm terminates at 228. If not, input data (sequence components of line current and line voltage) are obtained 232 as discussed with reference to FIG. 3. If the input is new 234, 235 then the testing mode of the COT-QGM algorithm terminates at 228. If not, the error in prediction, e, is calculated at 236 in a manner set forth in the discussion of FIG. 4. If the normalization of the error in prediction is less than the vigilance 238, 239 new sequence components are obtained at 232 and entered into the feed forward neural network 38. If the norm of the error in prediction is not less than the vigilance at 238, a stator turn fault is signaled at 240 to the user of the electric motor 14.

Although several training algorithms and corresponding testing algorithms have been embodied in the present invention, the selection of a particular training and testing algorithm is a design choice that depends on the intended use and application of the stator turn fault detector. It will be appreciated that the functionality of the stator turn fault detection system 10 is not limited to any particular testing and/or training algorithm.

The present invention contemplates the use of a stator turn fault detector for use with an electric motor, and more specifically, an AC motor 14. One application of such a stator turn fault detector 10 with an AC induction motor 14 is shown in FIG. 1. The stator turn fault detector 10 includes a plurality of sensors 22a, 22b, 26a, 26b to acquire current and voltage values from the AC induction motor 14 as well as a processor 30 to calculate the sequence components of the current values and the sequence components of the voltage values. A feed forward neural network 38 connected to the processor 30 receives the sequence components and determines an output value indicative of an estimated value of negative sequence current of the AC induction motor 14. A comparator 42 is further provided to compare the output values of the feed forward neural network 38 to a set of actual current values from the AC induction motor 14 to determine a fault value. The processor 30 applies a Synchronous Reference Frame transformation to the voltage and current values to determine the corresponding sequence components for use by the feed forward neural network 38. The feed forward neural network 38 includes an input layer having a number of inputs 36 corresponding to the number of sequence components to be inputted and a hidden layer having at least one neuron 52 and a number of weights 54. The number of neurons 52 and the value for each of the plurality of weights 54 is determined such that a value which estimates the negative sequence components of line current is determined when the weights 54 converge. When the proper value for each of the number of weights 54 and the correct number of neurons 52 have been determined, the neural network 38 is trained and ready for detection of a stator turn fault in the electric motor 14.

The present invention has been described in terms of the preferred embodiment, and it is recognized that equivalents, alternatives, and modifications, aside from those expressly stated, are possible and within the scope of the appending claims.

What is claimed is:

1. A stator turn fault detector for an AC motor comprising:
   a plurality of sensors to acquire a set of current values and a set of voltage values from an AC motor;
   a processor to apply a synchronous reference frame transformation to determine sequence components from the set of current values and the set of voltage values;
   a feed forward neural network (FFNN) connected to receive at least a portion of the sequence components from the set of current values and the set of voltage values as an input array and having an output to provide estimated values for at least two sequence phasors; and
   a comparator connected to the output of the FFNN to compare the estimated values to instantaneous values to provide a fault signal if the comparison exceeds a vigilance value, thereby indicating a stator turn fault.

2. The stator turn fault detector of claim 1 wherein the set of current values and the set of voltage values correspond to operating values of the AC motor under healthy operating conditions and are initially used to train the FFNN by calculating values for a set of weights in the FFNN.

3. The stator turn fault detector of claim 2 wherein the sequence components used for training include a positive current sequence component, a positive voltage sequence component, and a negative voltage sequence component.

4. The stator turn fault detector of claim 1 wherein the processor further calculates a negative current sequence component as the instantaneous value to compare to the estimated values.

5. The stator turn fault detector of claim 1 further comprising a Self-Organizing Feature Map (SOFM) to display the operating conditions of the AC motor.

6. The stator turn fault detector of claim 5 further comprising an input layer having at least one input vector, a hidden layer having a plurality of weights and at least one neuron, and an output layer having at least one neuron.

7. The stator turn detector fault of claim 1 wherein the motor is an AC induction motor.

8. The stator turn fault detector of claim 1 further comprising a fault indicator connected to the comparator to receive a fault signal to indicate to a user that a stator turn fault is present within the AC motor.

9. The stator turn fault detector of claim 8 wherein the fault indicator is further configured to inhibit further operation of the AC motor.

10. The stator turn fault detector of claim 1 wherein the feed forward neural network includes a hidden layer having a plurality of weights and a plurality of neurons, wherein the plurality of weights are adjusted during a training mode and remain constant during a run-mode.

11. A system to detect a stator turn fault in an AC motor comprising:
    at least one input to input operating data from an AC motor to a microprocessor, wherein the operating data comprises positive and negative voltage sequence components of a line voltage, and a positive current sequence component of a line current;
    a computer readable storage medium connected to the microprocessor having therein a computer program that, when executed, performs a synchronous reference frame transformation on the operating data and initiates a feed forward neural network to calculate estimated negative current sequence components based on the transformed data; and
    at least one output to output the estimated negative sequence component.

12. The system of claim 11 wherein the feed forward neural network comprises:
    an input layer having a number of input vectors, wherein the number of input vectors corresponds to a number of the sequence components input through the at least one input;
    a hidden layer having at least one neuron and at least one weight, wherein the at least one weight is adjusted during a training mode and remains constant during a run mode; and
    an output layer to determine at least one output vector, wherein the at least one vector includes the estimated negative sequence components.

13. The system of claim 11 wherein the computer program when executed further causes the microprocessor to indicate a turn fault value to a user of the AC motor based on the estimated negative sequence component.

14. The system of claim 13 wherein the turn fault value comprises the difference between the estimated negative sequence component and instantaneously acquired data, wherein the instantaneously acquired data includes an instantaneous vector having at least one instantaneous negative sequence component of the line current.

15. The system of claim 14 wherein the computer program when executed further causes the microprocessor to inhibit further operation of the AC motor when a stator turn fault is indicated based on the turn fault value.

16. An apparatus for detecting a stator turn fault in an AC motor, comprising:
  data acquisition means for receiving data from at least one AC motor wherein the data includes line voltage signals and line current signals from the at least one AC motor;
  a synchronous reference frame transformation means communicating with the data acquisition means for determining sequence components of at least a portion of the data;
  an integrating means, having a feed forward neural network, communicating with the transformation means for receiving the sequence components of at least a portion of the data and communicating with an outputting means for outputting estimated data of the at least one AC motor; and
  a comparing means for comparing the estimated data to instantaneous data acquired from the at least one AC motor during real-time.

17. The apparatus of claim 16 wherein the data acquisition means further comprises a digitizing means for converting the line voltage signals to digitized line voltage signals and for converting the line current signals to digitized line current signals.

18. The apparatus of claim 16 wherein the estimated data comprises estimated values for the negative sequence components of the line current of the at least one AC motor.

19. The apparatus of claim 16 wherein the instantaneous data comprises instantaneous values for the negative sequence components of the line current of the at least one AC motor.

20. The apparatus of claim 16 further comprising an indicating means for displaying a fault to a user of the at least one AC motor.

21. The apparatus of claim 16 wherein the data acquisition means acquires data during stator winding excitation irrespective of motor operation.

22. A computer-readable storage medium having stored thereon a computer program which, when executed by a computer, will cause the computer to:
  acquire operating data from an AC motor during a known normal operation;
  input at least a portion of the operating data to a feed forward neural network having a number of weights;
  train the feed forward network to determine converged values for each of the number of weights;
  store the converged values in memory;
  obtain an instantaneous operating parameter from the AC motor during instantaneous operation of the AC motor;
  perform a synchronous reference frame transformation on the instantaneous operating parameter to determine sequence components of the instantaneous operating parameter;
  input the sequence components into the feed forward neural network;
  obtain an estimated operating parameter of instantaneous operation of the AC motor; and
  compare the estimated operating parameter to the instantaneous operating parameter to determine a stator turn fault in the AC motor.

23. The computer readable storage medium of claim 22 wherein the computer program further causes the computer to output a fault value indicative of the stator turn fault when the fault value exceeds a vigilance.

24. The computer readable storage medium of claim 22 wherein the computer program stored thereon causes the computer to convert the instantaneous operating data to a digitized current signal and a digitized voltage signal.

25. The computer readable storage medium of claim 24 wherein the sequence components comprise a positive and a negative component of the line voltage and a positive sequence component of the line current.

26. The computer readable storage medium of claim 22 wherein the estimated parameter of instantaneous operation of the AC induction motor comprises an estimated negative sequence component of line current.

27. The computer readable medium of claim 22 wherein the computer program stored thereon causes the computer to indicate a fault value to an operator of the AC induction motor, wherein the fault value comprises the difference between the estimated operating parameter and the instantaneous operating parameter.

28. An apparatus to detect a stator turn fault of an AC motor comprising:
  at least two current sensors for obtaining at least two AC motor current signals;
  at least two voltage sensors for obtaining at least two AC motor voltage signals;
  an analog to digital converter for converting the at least two AC motor current signals to digitized current signals and the at least two AC motor voltage signal to digitized voltage signals;
  a microprocessor to receive the digitized signals and perform a synchronous reference frame transformation to determine sequence parameters of the AC motor; and
  a feed forward neural network to determine estimated fundamental frequency sequence parameters of the AC induction motor.

29. The apparatus of claim 28 wherein the fundamental frequency sequence parameters of the AC induction motor comprise:
  a magnitude and a phase of a positive and a negative sequence component of the digitized voltage signals; and
  a magnitude and a phase of a positive sequence component of the digitized current signals.

30. The apparatus of claim 28 wherein the feed forward neural network further comprises:
  a plurality of input layers to acquire the fundamental frequency sequence parameters;
  a hidden layer having a plurality of weights trained during a known good operating mode; and
  an output layer to produce the estimated fundamental frequency sequence parameters of the AC induction motor during operating conditions.

31. The apparatus of claim 28 wherein the microprocessor outputs a fault value to an operator of the AC induction motor by comparing the estimated fundamental frequency parameters to instantaneous fundamental frequency parameters of the AC induction motor, wherein the fault value comprises the difference between the estimated fundamental frequency parameters and instantaneous fundamental frequency parameters comprising negative components of instantaneous current.

32. A method of detecting a stator turn fault in a motor, comprising the steps of:
  acquiring training parameters from the motor during a known good condition of the motor;
  determining sequence phasors from the training parameters using a synchronous reference frame transformation;

determining estimated values indicative of a stator turn fault from the motor using a feed forward neural network;

acquiring instantaneous values from the motor while the motor is in service irrespective of whether the motor is running;

comparing the instantaneous values to the estimated values to determine a stator turn fault; and indicating a presence of a stator turn fault based on the comparison.

33. The method of claim 32 wherein the acquiring of training parameters further comprises the step of obtaining at least one motor current signal and at least two motor voltage signals.

34. The method of claim 32 wherein training the feed forward neural network includes the steps of:

inputting instantaneous values to an input layer, and converging a plurality of weights in a hidden layer to a steady state; and outputting estimated values in an output layer.

35. The method of claim 32 further comprising the step of calculating the difference of the instantaneous values and the estimated values.

36. A method of stator turn fault detection for an AC induction motor comprising the steps of:

(A) selecting the sequence phasor parameters for a feed forward neural network;

(B) training the feed forward neural network to learn a model of the AC induction motor under healthy operating conditions;

(C) acquiring a measured value of the AC induction motor while the AC induction motor is in service;

(D) performing a synchronous reference frame transformation on the measured value to determine sequence parameters of the AC induction motor;

(E) inputting the sequence parameters to the feed forward neural network to determine an estimated value of AC induction motor operation during healthy operating conditions;

(F) comparing the estimated value of AC induction motor operation with a measured value of the AC induction motor operation;

(G) periodically repeating steps (C)–(F); and (H) indicating a stator turn fault of the AC induction motor if the step of comparing results in a fault value that exceeds a vigilance threshold.

37. The method of claim 36 wherein the steps of selecting the sequence phasors of the feed forward neural network comprises the step of:

determining a number of network layers;

determining a number of network neurons, and determining weight values for the network layers.

38. The method of claim 36 wherein the step of training includes acquiring voltage and current data that comprises the steps of:

acquiring a magnitude of a positive sequence component of a line voltage;

acquiring a magnitude and phase of a negative sequence component of the line voltage; and acquiring a magnitude and phase of a positive sequence component of a line current.

39. The method of claim 36 further comprising repeating the steps of (A) and (B) for converging a plurality of weights to obtain a steady state operation condition.

40. The method of claim 38 wherein the estimated value is a negative sequence component of the line current.

* * * * *